United States Patent [19]

Kurata et al.

[11] 4,024,094
[45] May 17, 1977

[54] PHENOLIC RESIN COMPOSITION FOR LAMINATES

[75] Inventors: Masaharu Kurata; Mineaki Tanigaichi; Kazuyuki Ohya, all of Tokyo, Japan

[73] Assignee: Mitsubishi Gas Chemical Company, Inc., Tokyo, Japan

[22] Filed: Sept. 19, 1974

[21] Appl. No.: 507,337

[52] U.S. Cl. .............................. 260/19 N; 260/842
[51] Int. Cl.$^2$ ........................................ C08L 93/04
[58] Field of Search ............... 260/19 N, 19 R, 838, 260/842, 829

[56] References Cited

UNITED STATES PATENTS 2,927,089 3/1960 Copthorne ..................... 260/19 N
2,960,266 8/1960 Goldblum ......................... 260/842
3,138,563 6/1964 Morgon et al. .................. 260/19 N
3,294,862 12/1966 Prochaska ....................... 260/842

OTHER PUBLICATIONS

Symonds, 1949, p. 412.

*Primary Examiner*—Melvyn I. Marquis
*Assistant Examiner*—William Parker

[57] ABSTRACT

A phenolic resin composition for manufacturing laminates which comprises a modified phenolic resin having incorporated therewith 1–40% by weight of polycarbonate resin. The phenolic resin composition gives laminates with improved mechanical strength and workability without causing any lowering of surface hardness.

10 Claims, No Drawings

PHENOLIC RESIN COMPOSITION FOR LAMINATES

BACKGROUND OF THE INVENTION

This invention relates to a phenolic resin composition for manufacturing laminates. More particularly, this invention relates to a phenolic resin composition for manufacturing laminates which comprises a modified phenolic resin admixed with polycarbonate resin so as to improve the internal plasticity of the phenolic resin and permit the production of laminates excellent in mechanical strength, especially impact strength and in punchability without incurring considerably lowering of surface hardness.

Laminates made of a phenolic resin are widely used in various fields, for example, as materials for electric instruments. However, the laminates made of a phenolic resin involve some problem in mechanical strength and mechanical workability such as punchability. Accordingly, a number of methods have been proposed hitherto with an attempt to improve these properties. For example, a method wherein a grass fabric is used as base material in place of paper, pulp or cotton linter paper is adopted chiefly for the purpose of improving mechanical strength. This method serves to improve mechanical strength but on the other hand has such a drawback that mechanical workability such as punchability of products is deteriorated and the cost of product becomes higher. There is known a method for incorporating the phenolic resin with an epoxy resin to improve the properties of the former. According to this method, the crosslinking density of the product is increased to enhance hardness and mechanical strength thereof. On the other hand, however, the impact strength and punchability of the product are deteriorated according to this method. There is also known a method wherein an alkylphenol is used as the phenol component of the phenolic resin or wherein an internally plasticized phenolic resin obtained by reacting a phenolic resin with a drying oil is used. According to this method, punchability of the product is indeed improved but its mechanical strength is hardly improved and its hardness is rather decreased. In these prior art methods, an improvement in mechanical strength of laminates is accompanied by deterioration of punchability, or alternatively an improvement in punchability of laminates is accompanied by deterioration of mechanical strength and lowering of hardness. According to these prior art methods, therefore, it is quite unable to produce laminates improved in both mechanical strength and punchability from a phenolic resin. In general, a phenolic resin has a poor compatibility with polycarbonate resin. Laminated articles obtained by using a mixture of a phenolic resin and polycarbonate resin tend to delaminate, thus resulting in serious reduction of mechanical strength. Accordingly, a mixture of a phenolic resin and polycarbonate resin fails to give practically useful laminates with satisfactory mechanical properties. Thus, there is a great demand for development of a new type modified phenolic resin which can afford laminates with improved mechanical strength, hardness and punchability.

BRIEF SUMMARY OF THE INVENTION

It is an object of this invention to provide a modified phenolic resin composition suitable for manufacturing laminates with improved mechanical strength, hardness and punchability.

It is another object of this invention to provide a modified phenolic resin composition comprising a modified phenolic resin incorporated with polycarbonate resin.

It is still another object of this invention to provide laminates with improved mechanical strength, hardness and punchability derived from a base material impregnated with the modified phenolic resin composition.

Other and further objects, features and advantages of this invention will become apparent as the description proceeds.

DETAILED DESCRIPTION OF THE INVENTION

As the result of many researches made for developing laminates with improved mechanical strength, especially impact strength, jointly with improved punchability, it has now been found that a new type modified phenolic resin composition suitable for manufacturing such laminates can be obtained by incorporating a modified phenolic resin with a specific amount of polycarbonate resin. This invention has been accomplished on the basis of the above finding.

In accordance with this invention, there is provided a phenolic resin composition which comprises a modified phenolic resin having incorporated therewith 1–40% by weight of polycarbonate resin. The phenolic resin composition of this invention affords laminates which are improved in mechanical strength, especially impact strength and in punchability without causing lowering of surface hardness.

The modified phenolic resin used in the composition of this invention is prepared by reacting a phenol of the general formula:

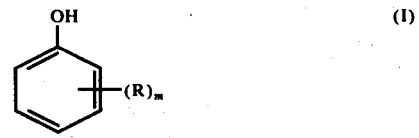

wherein R is methyl and $m$ is 0, 1 or 2, with a modifier selected from the group consisting of a drying oil, an aromatic hydrocarbon-formaldehyde resin, rosin, a petroleum resin or a higher alkylphenol or arylphenol of the general formula:

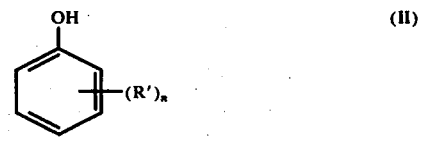

wherein R' is a long chain alkyl having at least 4 carbon atoms, phenyl or a substituted phenyl and $n$ is 1 to 2, and formaldehyde in the presence of a catalyst. The above reaction is generally carried out by reacting a phenol of the general formula (I) first with a modifier and then with formaldehyde. In case a higher alkylphenol or arylphenol of the general formula (II) is used as a modifier, however, the reaction is preferably carried out by first reacting the modifier with formaldehyde and then reacting the resultant product with a phenol of the general formula (I). Besides these reactions, a phenol of the general formula (I) may be reacted together with a modifier and formaldehyde.

Illustrative of the phenol of the general formula (I) are phenol itself, cresols and xylenols. Typical examples of the phenol of the general formula (II) include p-amylphenol, p-octylphenol, p-nonylphenol and p-phenylphenol. As the catalyst used for the above reaction, there can be mentioned acidic catalysts such as hydrochloric acid, sulfuric acid, phosphoric acid, zinc chloride, stannic chloride, aluminum chloride, $BF_3$-complexes, p-toluenesulfonic acid, m-xylenesulfonic acid, cobalt naphthenate and lead napththenate; and alkaline catalysts such as sodium hydroxide, potassium hydroxide, sodium carbonate, ammonia, hexamethylenetetramine, ethylenediamine and triethylenetetramine. Such catalyst is used generally in an amount of 0.1–10% by weight based on the phenol of the general formula (I), although the amount varies more or less according to the sort of the modifier and the mode of reaction. Formaldehyde, one of the reactants in the above reaction is used in an amount of at least one molar proportion to the phenol of the general formula (I).

Illustrative of the drying oil utilizable as modifier are, for example, linseed oil, tung oil, oil, dehydrated castor oil and oiticica oil. Examples of the aromatic hydrocarbon-formaldehyde resin include toluene-formaldehyde resin, xylene-formaldehyde resin and naphthalene-formaldehyde resin. These modifiers are used generally in an amount of at least 10% by weight, usually 20–200% by weight based on the phenol of the general formula (I).

The modified phenolic resin in this invention includes a drying oil-modified phenolic resin such as linseed oil-modified phenol resin, linseed oil-modified cresol resin, tung oil-modified phenol resin, tung oil-modified cresol resin, dehydrate castor oil-modified phenol resin, and the like; an aromatic hydrocarbon-formaldehyde resin-modified phenolic resin, such as xylene-formaldehyde resin-modified phenol resin, xylene-formaldehyde resin-modified cresol resin, and the like; a higher alkyl- or arylphenol-modified phenolic resin, such as p-nonylphenol-modified phenol resin, p-nonylphenol-modified cresol resin, p-phenylphenol-modified phenol resin, p-phenylphenol-modified cresol resin, p-phenylphenol-modified xylenol resin, and the like.

The modified phenolic resin prepared by the above-mentioned reaction is adjusted with an appropriate organic solvent to a desired resin concentration prior to actual use for manufacturing the resin composition. Examples of the organic solvent used in this case include alcohols such as methanol, ethanol and butanol; aromatic hydrocarbons such as benzene, toluene and xylene; ketones such as acetone, methyl ethyl ketone, methylisobutyl ketone and cyclohexanone; and a mixture of at least two of these.

The polycarbonate resin used as one of the constituents of the resin composition of this invention may be ordinary one prepared by the transesterification method wherein a carbonic diester derived from an aromatic hydroxy compound, for example, diphenyl carbonate is reacted with a dihydroxy compound such as bisphenol A or by the phosgene method wherein a dihydroxy compound such as bisphenol A is reacted with phosgene in the presence of catalyst. In addition, halogenated polycarbonate resins carrying halogen atoms in the aromatic nuclei can also be used equivalently as the polycarbonate resin. On incorporation of the polycarbonate resin into the modified phenolic resin, the polycarbonate resin is preferably dissolved in an organic solvent or may be pulverized to have a particle size of less than 40 mesh or slurried in a liquid. Examples of organic solvents for the polycarbonate resin include methylene chloride, dioxane, chlorobenzene and a mixture thereof.

In the resin composition of this invention, the polycarbonate resin is used in an amount of 1–40% by weight, preferably 5–20% by weight based on the modified phenolic resin. When the amount of the polycarbonate resin used exceeds 40% by weight, the product will undergo delamination or form on the surface thereof spots of the polycarbonate resin oozed out to cause imperfection of the surface and deterioration of mechanical properties such as impact strength. Accordingly, the proportion of the polycarbonate resin in the resin composition of this invention is critical to prevent deterioration in quality of the product.

In another embodiment of this invention, laminates are manufactured in a usual manner, using the resin composition. A base material such as paper, pulp, cotton linter paper, cloth, glass fabric or unwoven glass fabric is impregnated according to a usual method with a solution or dispersion of the resin composition previously adjusted to have a proper resin concentration, usually 35–70% by weight, and then dried to obtain a prepeg. Several sheets of the prepreg are piled up and then subjected to compression molding usually conducted at a temperature of 130°–170° C under pressure of 50–200 kg/cm², usually 150–160 kg/cm² to form a laminate. In the case of manufacturing a copper clad laminate, a desired number of the prepreg is piled up, then overlaid with a copper foil and finally subjected to compression molding conducted under the same conditions as described above.

Laminates of this invention obtained by using the modified phenolic resin composition have no tendency to delamination as seen in laminates obtained by using a mixture of unmodified phenolic resin and polycarbonate resin. Moreover, the laminates of this invention are significantly improved in both mechanical strength and workability and maintain high surface hardness so that they exhibit excellent impact strength and punchability for further processing. The laminates of this invention using the specific resin composition are not deteriorated in their electric characteristics but rather improved in these characteristics. In case the laminates are copper clad ones utilizable for printed circuit, they are low enough in shearing resistance so that a mechanical operation for punching the copper clad laminates by means of a press can be carried out at ordinary temperature and needs not necessarily put a heating step as a preliminary treatment before the mechanical operation unlike the prior art mechanical operation where such heating step is necessary prior to punching laminates. Besides these technical advantages, the laminates of this invention have such additional merits that they are excellent in dimensional stability and are free of any warp and torsion, thus enhancing workability and trustworthiness remarkably. The laminates of this invention have no or little tendency to lowering of surface hardness as often seen in laminates obtained by using the prior art internally plasticized phenolic resin.

This invention will be illustrated in more detail by way of examples wherein all the parts are by weight.

EXAMPLE 1

To a reaction product obtained by mixing 100 parts of xylene-formaldehyde resin with 60 parts of phenol, adding 0.5 part of p-toluenesulfonic acid to the mixture and then heating it were added 65 parts of 37% formaldehyde and 1 part of sodium hydroxide. The whole was subjected to condensation reaction conducted at 120°–130° C to obtain a xylene-formaldehyde resin-modified phenol resin. To this resin was then added a mixture of xylene and butanol to prepare a varnish (A) of a xylene-formaldehyde resin-modified phenol resin adjusted to have a resin content of 60% by weight.

On the other hand, a polycarbonate resin obtained according to a known conventional method from bisphenol A was dissolved in a mixture of methylene chloride and dioxane to prepare a solution (B) of the polycarbonate resin having a resin content of 15% by weight.

To 100 parts of the varnish (A) were added 45 parts of the solution (B) (containing 11.25% by weight of the polycarbonate resin for the phenolic resin) and the mixture was then stirred for 10 minutes under reflux at 40° C to prepare a solution of a resin composition containing the xylene-modified phenolic resin and the polycarbonate resin. A base material (cotton linter paper) was impregnated with the solution of the resin composition and then dried at 130° C for 6 minutes to obtain a prepreg containing 45% by weight of the resin composition. Nine sheets of the prepreg were piled up and the outermost surface of the piled sheets was overlaid with an adhesive-applied copper foil having a thickness of 35 μ. The piled sheets were then pressed at 160°–165° C under pressure of 150 kg/cm² to form a copper clad laminate having a thickness of 1.6 mm, the properties of which are shown in Table 1.

For the purpose of comparison, a similar test was carried out with a sample containing so polycarbonate resin and the result obtained is also shown parallelly with the above example in Table 1 as comparative example 1.

Table 1

|  |  | Example 1 | Comparative example 1 |
|---|---|---|---|
| Insulation *1 resistance (Ω) | as received | 3.4 × 10¹² | 2.1 × 10¹² |
|  | after boiling | 1.2 × 10¹⁰ | 2.8 × 10⁹ |
| Barcol impressor (Hardness) |  | 58 | 63 |
| Ball-dropping strength *2 (cm/g) |  | 0.91 | 0.45 |
| Izod impact value (kg.cm/cm²) |  | 4.9 | 3.1 |
| Shear resistance (kg/cm²) |  | 6.70 | 8.10 |
| Punchability *3 |  | Ordinary temperature Good | Ordinary temperature fair |

Remarks:
*1 Measured according to JIS K-6911
*2 Measured by dropping an iron ball weighing 55 g onto a test piece (25 mm × 55 mm × 1.6 mm) placed on a receiving bed. The value was obtained by dividing the height of the iron ball in the case of cracks or deformation being formed in the test piece by the weight of the iron ball.
*3 Measured according to ASTM D-617.

EXAMPLE 2

To a reaction product obtained by mixing 40 parts of linseed oil with 100 parts of phenol, adding dropwise 1 part of 98% sulfuric acid to the mixture and then heating it at 130°–170° C for 2 hours were added 110 parts of 37% formaldehyde and 4.0 parts of 28% ammonia water to effect condensation reaction of the reactants whereby a linseed oil-modified phenol resin was obtained. To this resin was added toluene to prepare a varnish (A) of a linseed oil-modified phenol resin adjusted to have a resin content of 60% by weight. To 100 parts of the varnish (A) were added 35 parts, 60 parts or 100 parts of the same solution (B) as described in Example 1 (containing 8.75%, 15% or 25% by weight, respectively, of the polycarbonate resin for the phenolic resin) and the mixture was then stirred for 10 minutes under reflux at 40° C to prepare a solution of a resin composition containing the linseed oil-modified phenol resin and the polycarbonate resin. A base material (cotton linter paper) was impregnated with the solution of the resin composition and then dried at 130° C for 10 minutes to obtain a prepreg containing 45, 48 or 53% by weight of the resin composition. The resulting prepreg was worked up in a manner similar to that described in Example 1 to prepare a copper clad laminate having a thickness of 1.6 mm, the properties of which are shown in Table 2.

For the purpose of comparison, a similar test was carried out with a sample containing no polycarbonate resin and the result obtained is also shown in Table 2 as comparative example 2.

Table 2

|  | Example 2 |  |  | Comparative example 2 |
|---|---|---|---|---|
| Amount of the solution (B) added (parts) | 35 | 60 | 100 |  |
| Insulation resistance (Ω) as received | 1.5 × 10¹¹ | 3.2 × 10¹² | 8.0 × 10¹² | 1.1 × 10¹¹ |
| after boiling | 3.2 × 10⁸ | 1.7 × 10⁹ | 9.8 × 10⁸ | 5.5 × 10⁷ |
| Barcol impressor (Hardness) | 32 | 32 | 28 | 33 |
| Izod impact value (kg.cm/cm²) | 5.9 | 7.2 | 4.1 | 2.8 |
| Shear resistance (kg/cm²) | 5.28 | 4.98 | 3.85 | 6.70 |
| Punchability | Ordinary temperature Excellent | Ordinary temperature Very good | Ordinary temperature Very good | Ordinary temperature Good |
|  | Heated at 100° C for 10 min. Excellent | Heated at 100° C for 10 min. Excellent | Heated at 100° C for 10 min. Excellent | Heated at 100° C for 10 min. Very good |

EXAMPLE 3

To a reaction product obtained by mixing 20 parts of linseed oil with 100 parts of m-cresol, adding 10 parts of a 60% dispersion of lead naphthenate to the mixture and then heating it at 130°–150° C for 30 minutes were added 98 parts of 37% formalin and the whole was reacted under reflux for 3 hours. To the reaction product was added acetone to prepare a varnish (A) of a linseed oil-modified cresol resin adjusted to have a resin content of 60% by weight. To 100 parts of the varnish (A) were added 60 parts of the same solution (B) as described in Example 1, (containing 15% by weight of the polycarbonate resin for the cresol resin) to obtain a solution of a resin composition containing the linseed oil-modified cresol resin and the polycarbonate resin. Cotton linter paper was impregnated with the solution of the resin composition and then dried at 130° C for 10 minutes to obtain a prepreg containing 41% by weight of the resin composition. The resulting prepreg was worked up in a manner similar to that described in Example 1 to prepare a copper clad laminate having a thickness of 1.6 mm, the properties of which are shown in Table 3.

Table 3

| Insulation resistance ($\Omega$) | | Barcol impressor (Hardness) | Ball-dropping strength (cm/g) | Izod impact value (kg.cm/cm²) | Shear resistance (kg/cm²) | Punch-ability |
| --- | --- | --- | --- | --- | --- | --- |
| As received | After boiling | | | | | |
| $4.8 \times 10^{13}$ | $2.6 \times 10^{10}$ | 48 | 1.13 | 7.8 | 5.33 | Ordinary temperature Excellent |

EXAMPLE 4

60 Parts of p-nonylphenol, 157 parts of 37% formalin and 5 parts of ethylenediamine were reacted for 2 hours under reflux and then cooled to 80° C. To this reaction mixture were added 100 parts of m-cresol and the mixture was reacted for 1 hour under reflux and then dehydrated. A mixture of xylene and butanol was added to the reaction product to prepare a varnish (A) of a p-nonylphenol-modified cresol resin adjusted to have a resin content of 60% by weight. To 100 parts of the varnish (A) were added 60 parts of the same solution (B) as described in Example 1 to obtain a solution of a resin composition of this invention. A base material similar to that used in Example 1 was impregnated with the solution of the resin composition and then dried at 135° C for 10 minutes to obtain a prepreg containing 47% by weight of the resin composition. Nine sheets of the prepreg were piled up and the outermost surface of the piled sheets was overlaid with an adhesive-applied copper foil having a thickness of 35 $\mu$. The piled sheets were then pressed at 155° –160° C under pressure of 150 kg/cm² for 70 minutes to form a copper clad laminate having a thickness of 1.6 mm, the properties of which are shown in Table 4.

Table 4

| Insulation resistance ($\Omega$) | | Barcol impressor (Hardness) | Ball-dropping strength (cm/g) | Izod impact value (kg.cm/cm²) | Shear resistance (kg/cm²) | Punch-ability |
| --- | --- | --- | --- | --- | --- | --- |
| As received | After boiling | | | | | |
| $4.3 \times 10^{13}$ | $5.2 \times 10^{10}$ | 64 | 0.77 | 3.8 | 7.92 | Ordinary temperature Very good |

EXAMPLE 5

68 Parts of p-phenylphenol, 139 parts of 37% formalin and 6 parts of ethylenediamine were reacted for 3 hours under reflux and then cooled to 80° C. To this reaction mixture were added 104 parts of xylenol (containing at least 50% of 3,5-dimethylphenol) and the mixture was reacted for 1 hour under reflux and then dehydrated under reduced pressure. A mixture of xylene and methanol was added to the reaction product to prepare a varnish (A) of a p-phenylphenol-modified xylenol resin adjusted to have a resin context of 60% by weight. To 100 parts of this resin were added 45 parts of the same solution (B) as described in Example 1 to obtain a solution of a resin composition of this invention. A base material similar to that used in Example 1 was impregnated with the solution of the resin composition and then dried at 145° C for 10 minutes to obtain a prepreg containing 46% by weight of the resin composition. Nine sheets of the prepreg were piled up and then pressed at 160°–165° C for 80 minutes under pressure of 150 kg/cm² to form a laminate having a thickness of 1.5 mm, the properties of which are shown in Table 5.

Table 5

| Insulation resistance ($\Omega$) | | Barcol impressor (Hardness) | Ball-dropping strength (cm/g) | Izod impact value (kg.cm/cm) | Shear resistance (kg/cm²) | Punch-ability |
| --- | --- | --- | --- | --- | --- | --- |
| As received | After boiling | | | | | |
| $2.2 \times 10^{12}$ | $6.8 \times 10^{9}$ | 58 | 0.60 | 3.5 | 7.30 | Ordinary temperature Very good |

What is claimed is:
1. A phenolic resin composition for manufacturing laminates which comprises a modified phenolic resin having incorporated therewith 1–40% by weight of polycarbonate resin wherein said modified phenolic resin is a reaction product obtained by reacting a phenol of the general formula

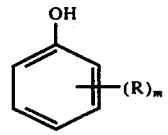

(I)

wherein R is methyl and m is 0, 1 or 2, with a modifier and formaldehyde in the presence of a catalyst, wherein said modifier is selected from the group consisting of a drying oil, an aromatic hydrocarbon-formaldehyde resin, rosin, a petroleum resin and a higher alkyl- or arylphenol of the general formula

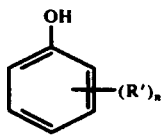 (II)

wherein R' is a long chain alkyl having at least 4 carbon atoms, phenyl or a substituted phenyl and n is 1 or 2.

2. A composition according to claim 1 wherein said polycarbonate resin is used in an amount of 5–20% by weight based on said phenolic resin.

3. A composition according to claim 1 wherein said modifier is a drying oil.

4. A composition according to claim 3 wherein said drying oil is selected from linseed oil, tung oil, soybean oil, dehydrated castor oil and oiticica oil.

5. A composition according to claim 3 wherein said aromatic hydrocarbon-formaldehyde resin is selected from toluene-formaldehyde resin, xylene-formaldehyde resin and naphthalene-formaldehyde resin.

6. A composition according to claim 1 wherein said modifier is used in an amount of 20–200% by weight based on the phenol of general formula (I).

7. A composition according to claim 1 wherein said modifier is an aromatic hydrocarbonformaldehyde resin.

8. A composition according to claim 1 wherein said modifier is a rosin.

9. A composition according to claim 1 wherein said modifier is a petroleum resin.

10. A composition according to claim 1 wherein said modifier is a phenol of the general formula:

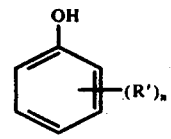

wherein R' is one of a long chain alkyl having at least 4 carbon atoms, a phenyl and a substituted phenyl, and n is 1 or 2.

* * * * *